(12) United States Patent
Takahashi et al.

(10) Patent No.: US 12,274,005 B2
(45) Date of Patent: Apr. 8, 2025

(54) COIL COMPONENT AND ELECTRONIC DEVICE

(71) Applicant: TAIYO YUDEN CO., LTD., Tokyo (JP)

(72) Inventors: Osamu Takahashi, Takasaki (JP); Yasuyuki Taki, Takasaki (JP)

(73) Assignee: TAIYO YUDEN CO., LTD, Tokyo (JP)

( * ) Notice: Subject to any disclaimer, the term of this patent is extended or adjusted under 35 U.S.C. 154(b) by 1058 days.

(21) Appl. No.: 17/204,841

(22) Filed: Mar. 17, 2021

(65) Prior Publication Data
US 2021/0304950 A1 Sep. 30, 2021

(30) Foreign Application Priority Data
Mar. 31, 2020 (JP) .................. 2020-064502

(51) Int. Cl.
| H05K 1/18 | (2006.01) |
| H01F 27/28 | (2006.01) |
| H01F 27/29 | (2006.01) |
| H01F 41/04 | (2006.01) |

(52) U.S. Cl.
CPC ......... *H05K 1/181* (2013.01); *H01F 27/2804* (2013.01); *H01F 27/292* (2013.01); *H01F 41/043* (2013.01); *H01F 2027/2809* (2013.01); *H05K 2201/1003* (2013.01); *Y10T 428/32* (2015.01)

(58) Field of Classification Search
CPC ............ H05K 1/181; H05K 2201/1003; H01F 27/2804; H01F 27/292; H01F 27/29; H01F 2027/2809; H01F 41/043; H01F 41/042
See application file for complete search history.

(56) References Cited

U.S. PATENT DOCUMENTS

| 8,749,339 B2 * | 6/2014 | Ogawa ...................... H01F 1/26 336/83 |
| 2019/0206612 A1* | 7/2019 | Tsuduki .................. H01F 27/28 |
| 2020/0111608 A1* | 4/2020 | Sato ....................... H01F 41/046 |

FOREIGN PATENT DOCUMENTS

| JP | H05342907 A | 12/1993 |
| JP | H09115329 A | 5/1997 |

* cited by examiner

*Primary Examiner* — Holly Rickman
(74) *Attorney, Agent, or Firm* — Law Office of Katsuhiro Arai (57) ABSTRACT

A coil component includes: a substrate body containing metal magnetic grains whose primary component is iron and which contains silicon and a metal that oxidizes more easily than iron, and an oxide layer covering the surfaces of the metal magnetic grains and joining multiple numbers of the metal magnetic grains together; a coil conductor provided in the substrate body; external electrodes provided on the surface of the substrate body and electrically connected to the coil conductor; and a bonding part positioned between the metal magnetic grains and the external electrodes, wherein the concentration of iron decreases in a substantially continuous manner from the metal magnetic grains to the external electrodes. The external electrodes can have improved joining strength.

7 Claims, 8 Drawing Sheets

FIG. 7A Comparative Example
Silicon

FIG. 7B Comparative Example
Chromium

FIG. 7C Comparative Example
Oxygen

FIG. 7D Comparative Example
Iron

FIG. 7E Comparative Example
Silver

FIG. 8A Silicon

1 μm

FIG. 8B Chromium

1 μm

FIG. 8C Oxygen

1 μm

FIG. 8D Iron

1 μm

FIG. 8E Silver

COIL COMPONENT AND ELECTRONIC DEVICE

CROSS-REFERENCE TO RELATED APPLICATIONS

The present application claims priority to Japanese Patent Application No. 2020-064502, filed Mar. 31, 2020, the disclosure of which is incorporated herein by reference in its entirety including any and all particular combinations of the features disclosed therein.

BACKGROUND

Field of the Invention

The present invention relates to a coil component and an electronic device.

Description of the Related Art

Coil components whose substrate body is formed with metal magnetic grains offering excellent direct-current superimposition property, instead of ferrite, are proposed. External electrodes are provided on the surface of the substrate body. For example, forming external electrodes with a conductive paste containing metal powder, glass frit, and organic vehicle, on the surface of a substrate body constituted by a ceramic sintered body, is known (refer to Patent Literatures 1 and 2, for example).

BACKGROUND ART LITERATURES

[Patent Literature 1] Japanese Patent Laid-open No. Hei 05-342907
[Patent Literature 2] Japanese Patent Laid-open No. Hei 09-115329

SUMMARY

When external electrodes are formed with a conductive paste containing glass frit, on the surface of a substrate body that contains metal magnetic grains whose primary component is iron, as well as an oxide layer covering the surfaces of the metal magnetic grains and joining multiple metal magnetic grains together, sufficient joining strength may not be achieved between the substrate body and the external electrodes.

The present invention was made in light of the aforementioned problems, and its object is to improve the joining strength of the external electrodes.

The present invention is a coil component comprising: a substrate body containing: metal magnetic grains whose primary component is iron and which contains silicon and a metal that oxidizes more easily than iron; and an oxide layer covering the surfaces of the metal magnetic grains and joining multiple numbers of the metal magnetic grains together; a coil conductor provided in the substrate body; external electrodes provided on the surface of the substrate body and electrically connected to the coil conductor; and a bonding part (adhesive layer) positioned between and bonding as an adhesive (which can be a sole adhesive) the metal magnetic grains and the external electrodes, wherein the concentration of iron decreases in a substantially continuous manner from the metal magnetic grains to the external electrodes.

The aforementioned constitution may be one wherein the bonding part between the metal magnetic grains and the external electrodes is such that, when the total quantity of iron, silicon, the metal that oxidizes more easily than iron, oxygen, and the metal element in the external electrodes, represents 100 percent by weight, the concentration of the metal that oxidizes more easily than iron is lower than the concentration of iron, but higher than the concentration of oxygen, between its interface with the metal magnetic grains and its interface with the external electrodes.

The aforementioned constitution may be one wherein the bonding part between the metal magnetic grains and the external electrodes is such that the concentration of the metal that oxidizes more easily than iron is higher than the concentration of silicon between its interface with the metal magnetic grains and its interface with the external electrodes.

The aforementioned constitution may be one wherein the bonding part between the metal magnetic grains and the external electrodes is such that, when the total quantity of iron, silicon, the metal that oxidizes more easily than iron, oxygen, and the metal element in the external electrodes, represents 100 percent by weight, the ratio of the concentration of oxygen, to the concentration of the metal that oxidizes more easily than iron, is lower than 2 between its interface with the metal magnetic grains and its interface with the external electrodes.

The aforementioned constitution may be one wherein the bonding part between the metal magnetic grains and the external electrodes is such that, when the total quantity of iron, silicon, the metal that oxidizes more easily than iron, oxygen, and the metal element in the external electrodes, represents 100 percent by weight, the concentration of the metal that oxidizes more easily than iron is higher than the concentration of oxygen between its interface with the metal magnetic grains and its interface with the external electrodes.

The aforementioned constitution may be one wherein the bonding part between the metal magnetic grains and the external electrodes is such that, when the total quantity of iron, silicon, the metal that oxidizes more easily than iron, oxygen, and the metal element in the external electrodes, represents 100 percent by weight, an EDS surface analysis of 20 of the metal magnetic grains will not detect any part of its interface with the metal magnetic grains where the concentration of silicon is 10 percent by weight or higher.

The aforementioned constitution may be one wherein: the external electrodes contain a metal element as a primary component; and over the entire range of a square whose one side is ⅓d and which is located at an arbitrary position in a region, of the external electrode, away by at least ½d from the bonding part between the metal magnetic grains and the external electrode toward the surface side of the external electrode, where d represents the thickness of the external electrode, the concentration of the metal element is 90 percent by weight or higher, while the concentration of a glass component is lower than 1 percent by weight.

The aforementioned constitution may be one wherein the metal element in the external electrodes is silver.

The aforementioned constitution may be one wherein the bonding part between the metal magnetic grains and the external electrodes is such that its thickness over the shortest distance between the metal magnetic grains and the external electrodes is 10 nm or greater but no greater than 100 nm.

The present invention is a coil component comprising: a substrate body containing: metal magnetic grains whose primary component is iron and which contains silicon and a metal that oxidizes more easily than iron; and an oxide layer covering the surfaces of the metal magnetic grains and joining multiple numbers of the metal magnetic grains together; a coil conductor provided in the substrate body; external electrodes provided on the surface of the substrate body, electrically connected to the coil conductor, and containing a metal element as a primary component; and a bonding part positioned between the metal magnetic grains and the external electrodes, wherein the concentration of iron is lower on the external electrode side than on the metal magnetic grain side; wherein, over the entire range of a square whose one side is ⅓d and which is located at an arbitrary position in a region, of the external electrode, away by at least ½d from the bonding part between the metal magnetic grains and the external electrode toward the surface side of the external electrode, where d represents the thickness of the external electrode, the concentration of the metal element is 90 percent by weight or higher, while the concentration of silicon (Si) is lower than 1 percent by weight.

The present invention is an electronic device comprising: the coil component described above; and a circuit board on which the coil component is mounted.

According to the present invention, the joining strength of the external electrodes can be improved.

DESCRIPTION OF THE SYMBOLS

10 Substrate body
20, 26 Cover layer
21 to 25 Magnetic layer
30 Coil conductor
31 to 35 Conductor pattern
36 Coil axis
37, 38 Via
40 Metal magnetic grain
41 Bonding part
45 Oxide layer
50, 51 External electrode
80 Circuit board
81 Electrode
82 Solder
100 Coil component
200 Electronic device
340 Metal magnetic grain
341 Oxide layer
341a First oxide layer
341b Second oxide layer
350 External electrode

DETAILED DESCRIPTION OF EMBODIMENTS

Embodiments of the invention under the present application for patent are explained below by referring to the drawings as deemed appropriate. It should be noted, however, that the invention under the present application for patent is not limited to the illustrated modes. Also, components that are common to multiple drawings are indicated using the same reference symbols in all of the multiple drawings. Attention is drawn to the fact that, for the convenience of explanation, each drawing is not necessarily to scale.

[First Aspect]

Figure 1A:
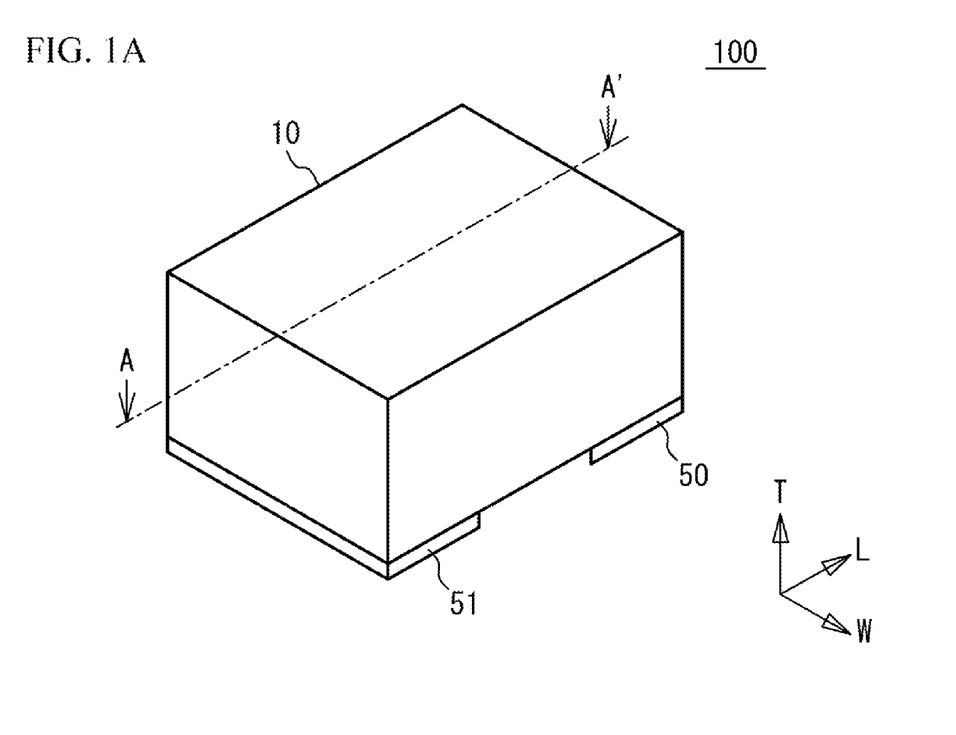
FIG. 1A is a perspective view of the coil component pertaining to a first aspect of the invention under the present application for patent.
Figure 1B:
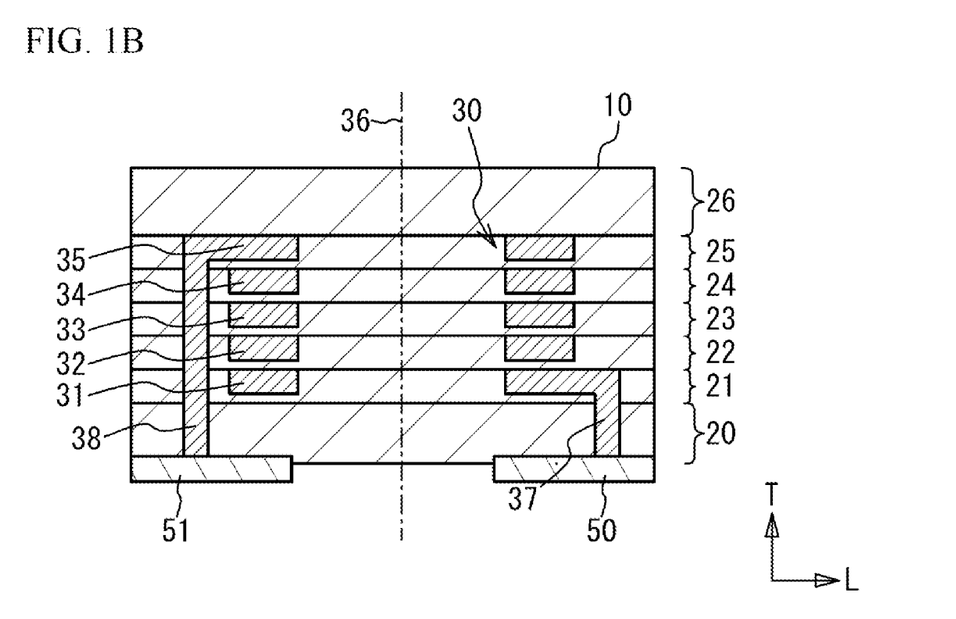
FIG. 1B is a view of cross-section A-A' in FIG. 1A.

FIG. 1A is a perspective view of the coil component pertaining to the first aspect of the invention under the present application for patent, and FIG. 1B is a view of cross-section A-A' in FIG. 1A. In FIGS. 1A and 1B, an example where the coil component is a multilayer inductor, for instance, is shown. With reference to FIGS. 1A and 1B, the coil component 100 comprises a substrate body 10, a coil conductor 30 built into the substrate body 10, and external electrodes 50, 51 provided on the surface of the substrate body 10. The substrate body 10 is formed in a roughly rectangular solid shape. The "length" direction, "width" direction and "thickness" direction of the coil component 100 are illustrated as the "L" direction, "W" direction and "T" direction, respectively. The substrate body 10 has a length dimension (dimension in the L-axis direction) of 0.2 to 6.0 mm, a width dimension (dimension in the W-axis direction) of 0.1 to 4.5 mm, and a thickness dimension (dimension in the T-axis direction) of 0.1 to 4.0 mm, for example.

The substrate body 10 is a laminate body in which cover layers 20, 26 and magnetic layers 21 to 25 are stacked. Conductor patterns 31 to 35 are formed on the magnetic layers 21 to 25. The cover layers 20, 26 and magnetic layers 21 to 25 are formed in a manner containing metal magnetic grains whose primary component is iron (Fe), as well as an oxide layer covering the surfaces of the metal magnetic grains and joining multiple metal magnetic grains together. This will be discussed later.

The conductor patterns 31 to 35 are embedded in the magnetic layers 21 to 25 and also their top faces are roughly flush with the top faces of the magnetic layers 21 to 25. The conductor patterns 32 to 35 include vias (not illustrated) that run through the magnetic layers 22 to 25. The conductor patterns 31 to 35 are electrically connected by way of the vias that run through the magnetic layers 22 to 25. A coil conductor 30 is formed as a result of the conductor patterns 31 to 35 connected electrically. The coil conductor 30 has a coil axis 36. The coil conductor 30 is formed by the conductor patterns 31 to 35 in a manner winding around the coil axis 36, and embedded in the substrate body 10. The coil axis 36 extends in the T-axis direction. The cover layers 20, 26 and magnetic layers 21 to 25 are stacked in the T-axis direction. This means that the direction of the coil axis 36 roughly matches the stacking direction of the cover layers 20, 26 and magnetic layers 21 to 25. The conductor patterns 31 to 35 are formed in a manner containing a metal having high conductivity; for example, they are formed by silver (Ag), palladium (Pd), copper (Cu), aluminum (Al), or an alloy thereof.

The external electrodes 50, 51 are provided on the bottom face of the substrate body 10, or specifically on the side of the cover layer 20 opposite the magnetic layer 21. The external electrodes 50, 51 are embedded at least partially in the substrate body 10 and their surface parts are exposed on the substrate body 10. The surface part of the external electrode 50 may project beyond the substrate body 10. The external electrode 50 is electrically connected to the conductor pattern 31 by way of a via 37 provided in the magnetic layer 21 and cover layer 20. The external electrode 51 is electrically connected to the conductor pattern 35 by way of a via 38 provided in the magnetic layers 21 to 25 and cover layer 20. The external electrodes 50, 51 are formed in a manner containing silver (Ag) or other metal, for example.

Figure 2:
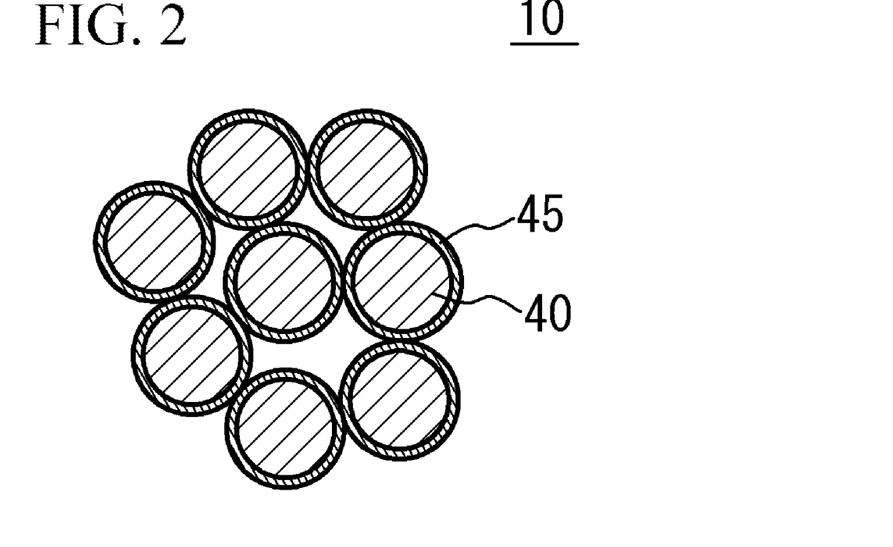
FIG. 2 is an enlarged schematic view of a part of the substrate body.

FIG. 2 is an enlarged schematic view of a part of the substrate body. With reference to FIG. 2, the substrate body 10 has metal magnetic grains 40 as well as an oxide layer 45 covering the surfaces of the metal magnetic grains 40, and is formed as a result of the bonding of multiple metal magnetic grains 40 via the oxide layer 45. The oxide layer 45 contains oxides of the elements constituting the metal magnetic grains 40. The substrate body 10 has insulating property as a result of the bonding of multiple metal magnetic grains 40 via the oxide layer 45. Presence of the oxide layer 45 can be recognized as a contrast (brightness) difference on an image of a randomly selected cross-section of the substrate body 10, captured by a scanning electron microscope (SEM) at a magnification of around 5000 to 15000 times, for example.

The metal magnetic grains 40 are soft magnetic grains whose primary component is iron, and they may be alloy grains or pure iron grains. "Primary component is iron" means the percentage of iron relative to the total quantity of the elements constituting the metal magnetic grains 40 is 50 percent by weight or higher, where it may be 80 percent by weight or higher or 90 percent by weight or higher. For example, the metal magnetic grains 40 may be alloy grains containing iron and silicon, or alloy grains containing iron and a metal element M whose ionization tendency is stronger than that of iron (thus oxidizing more easily than iron). The metal element M may be, for example, chromium (Cr), aluminum (Al), zirconium (Zr), titanium (Ti), manganese (Mn), etc. As an example, the metal magnetic grains 40 may be alloy grains of iron, silicon, and at least one type of metal element M whose ionization tendency is stronger than that of iron (such as at least one of chromium and aluminum). The percentage of iron may be 85 to 97 percent by weight, the percentage of silicon may be 1.5 to 7 percent by weight, and the percentage of the metal element M may be 1.5 to 8 percent by weight. The metal magnetic grains 40 may contain unintended impurities such as oxygen (O) and/or carbon (C). The percentage of impurities may be 1 percent by weight or lower. Also, the metal magnetic grains 40 may contain cobalt (Co), nickel (Ni), copper (Cu), sulfur(S), phosphorus (P), and/or boron (B), etc. The composition ratio of the metal magnetic grains 40 can be calculated, for example, by capturing a randomly selected cross-section of the substrate body 10 with a SEM at a magnification of around 3000 to 20000 times and then analyzing the result according to the ZAF method based on energy dispersive X-ray spectroscopy (EDS).

[Manufacturing Method]

An example of how the coil component in the first aspect is manufactured, is explained. First, a magnetic paste containing metal magnetic grains whose primary component is iron, is applied on polyethylene terephthalate (PET) base films or other base films according to the doctor blade method, etc., for example, and then dried using a hot-air dryer or other dryer, to form magnetic films. At prescribed positions on the magnetic films, through holes are formed using a laser, for example. On the magnetic films, a silver paste, copper paste, or other conductive paste is applied by means of screen printing or other printing method, for example, and then dried using a hot-air dryer or other dryer, to form precursors to conductor patterns. On the magnetic films, a magnetic paste containing metal magnetic grains whose primary component is iron, is applied by means of screen printing or other printing method, for example, and then dried using a dryer, to form magnetic films around the conductor patterns. Thereafter, the base films are peeled. This way, magnetic layers 21 to 25 on/in which conductor patterns 31 to 35 and vias 37, 38 have been provided, are formed.

A magnetic paste containing metal magnetic grains whose primary component is iron, is applied on PET base films or other base films according to the doctor blade method, etc., for example, and then dried using a hot-air dryer or other dryer, to form magnetic films. If necessary, each magnetic film is punctured at prescribed positions using a laser, for example, after which a silver paste, copper paste or other conductive paste is applied by means of screen printing or other printing method, for example, and then dried using a hot-air dryer or other dryer, to form precursors to vias. Thereafter, the base films are peeled. This way, a cover layer 20 in which vias 37, 38 have been provided, and a cover layer 26 in which no vias are provided, are formed.

A conductive paste containing a silver powder or other metal powder, for example, but containing virtually no glass frit, is applied on a PET base film or other base film, and then dried using a hot-air dryer or other dryer, to form precursors to external electrodes. "Containing virtually no glass frit" means the content ratio of glass frit is lower than 1 percent by weight. On top of the above, a magnetic paste containing metal magnetic grains whose primary component is iron, is applied by means of screen printing or other printing method, for example, and then dried using a dryer, to form a magnetic film with external electrodes embedded in it. The magnetic film is punctured at prescribed positions using a laser, for example, after which a silver paste, copper paste or other conductive paste is applied by means of screen printing or other printing method, for example, and then dried using a hot-air dryer or other dryer, to form precursors to vias. Thereafter, the base film is peeled. This way, an electrode-containing layer is formed.

The magnetic layers, cover layers, and electrode-containing layer are stacked in a prescribed order. It should be noted that precursors to external electrodes may be formed by stacking only the magnetic layers and cover layers, applying at prescribed positions a conductive paste containing a silver powder or other metal powder but containing virtually no glass frit, and then drying the paste using a hot-air dryer or other dryer. Thereafter, the layers are compression-bonded at high pressure (such as 10 MPa or higher). Here, the compression-bonding may be performed by sandwiching the top and bottom of the laminate body with flat metal plates to ensure flatness. The precursors to external electrodes have been formed so that they will sink into the cover layer as a result of the compression-bonding. Thereafter, the compression-bonded body is cut into individual chips, which are given a binder-removal treatment, etc., and then heat-treated at a prescribed temperature (such as 600 to 900° C.) in an oxygen-containing atmosphere. This heat treatment causes an oxide layer containing oxides of the material components of the metal magnetic grains to form on the surfaces of the metal magnetic grains contained in the magnetic layers, cover layers, and electrode-containing layer, while allowing multiple metal magnetic grains to bond together via the oxide layer. As a result, a substrate body 10 is formed. Embedded in the substrate body 10 is a coil conductor 30 formed by the conductor patterns 31 to 35. Formed on the surface of the substrate body 10 are external electrodes 50, 51 that are embedded in the substrate body 10. Thereafter, the external electrodes 50, 51 are plated. It should be noted that, traditionally, glass frit is contained in the conductive paste from which external electrodes are formed, so that the glass frit would function as a sintering auxiliary and thus permit heat treatment at a temperature below the temperature that causes the metal in the external electrodes to sinter. In the first aspect, where glass frit is not used, the laminate body is compression-bonded at high pressure and therefore the metal in the external electrodes has densely-contacting grain boundaries, which permits heat treatment at a temperature below the temperature that causes the metal to sinter.

[Where Substrate Body and External Electrode Are Joined]

Figure 3:
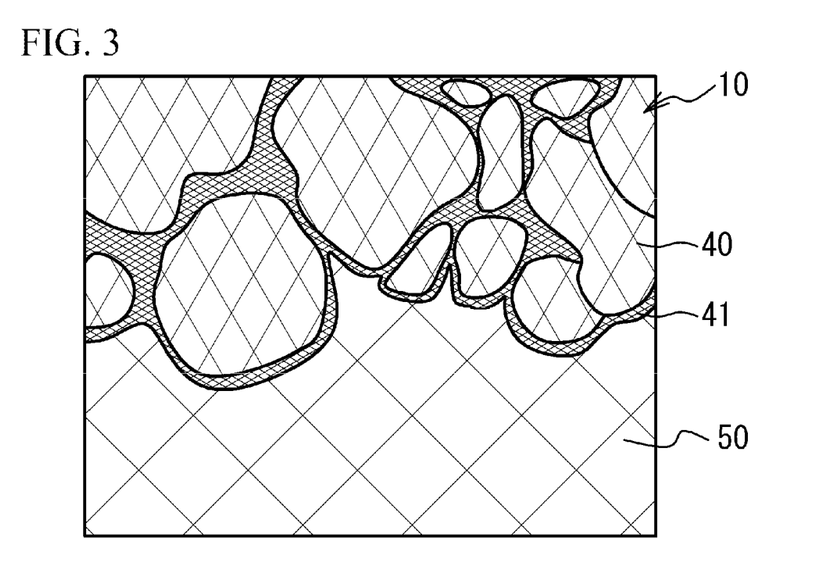
FIG. 3 is an enlarged cross-sectional view of where the substrate body and an external electrode are joined in the first aspect of the present invention.

FIG. 3 is an enlarged cross-sectional view of where the substrate body and an external electrode are joined in the first aspect of the present invention. While FIG. 3 shows an example of where the substrate body 10 and the external electrode 50 are joined, structures where the substrate body 10 and the external electrode 51 are joined are substantially similar to those shown in FIG. 3. With reference to FIG. 3, the external electrode 50 is joined to the substrate body 10 via a bonding part 41 provided on the surfaces of the metal magnetic grains 40. The bonding part 41 is formed by the heat treatment given when the substrate body 10 is formed. The metal magnetic grains 40 may already have an oxide layer on their surface, and this oxide layer may be converted into a part of the bonding part 41 by the heat treatment given when the substrate body 10 is formed. Since the primary component of the metal magnetic grains 40 is iron, the bonding part 41 contains oxides of iron ($Fe_2O_3$, $Fe_3O_4$, etc.). The composition of the bonding part 41 can be calculated by capturing a randomly selected cross-section of where the substrate body 10 and the external electrode 50 are joined using a SEM at a magnification of around 3000 to 20000 times, and then analyzing the result according to the ZAF method based on EDS.

Here, a situation where the bonding part is formed by an oxide layer on the surfaces of the metal magnetic grains, is explained. The metal element constituting the external electrode is firmly bonded by sintering, while the metal magnetic grains constituting the substrate body are firmly bonded as a result of the bonding together of the oxide layers on their respective surfaces. By contrast, the oxide layer between the metal magnetic grains and the external electrode contains the same types of elements as found in the metal magnetic grains and thus are bonded relatively firmly with the metal magnetic grains; however, its bonding force with the metal element constituting the external electrode is weak and therefore sufficient joining strength may not be achieved between the substrate body and the external electrode. Additionally, when an external stress is applied, an oxide layer having small thickness can let the stress released to the metal magnetic grains that are bonded to it; in the case of an oxide layer having large thickness, however, the oxide layer undergoes internal failure when an external stress is applied, before the stress can be released to the metal magnetic grains that are bonded to it. For this reason, desirably the oxide layer does not have large thickness.

The strength of the oxide layer changes according to the local composition of each part thereof. For example, as the concentration of iron changes inside the oxide layer between the metal magnetic grains and the external electrode, in the direction from the metal magnetic grains toward the external electrode, the strength of each affected part changes. When the concentration of iron changes smoothly and continuously inside the oxide layer in the direction from the metal magnetic grains toward the external electrode, it means the strength of the oxide layer changes smoothly and continuously. "The concentration of iron changes continuously" includes absence of abrupt component changes. By contrast, when the concentration of iron increases and decreases inside the oxide layer in the direction from the metal magnetic grains toward the external electrode, it means the strength of the oxide layer changes in an increasing or decreasing fashion. If an external stress is applied, the stress will be dispersed over the entire oxide layer when the strength of the oxide layer changes smoothly and continuously. When the strength of the oxide layer increases and decreases, on the other hand, an external stress will likely concentrate in the affected part where the strength changes, thereby causing the strength of the oxide layer to drop. Preferably there is no part in the oxide layer where its strength increases and decreases, because if there is such a part, the oxide layer becomes thicker by the thickness of the part, which makes the oxide layer vulnerable to internal failure. For these reasons, sufficient joining strength may not be achieved between the substrate body 10 and the external electrode 50 depending on the property of the bonding part 41 (which may be considered to be an oxide layer) positioned between the metal magnetic grains 40 and the external electrode 50.

In the first aspect, the bonding part 41 positioned between the metal magnetic grains 40 and the external electrode 50 is such that the concentration of iron decreases in a substantially continuous manner from the metal magnetic grains 40 to the external electrode 50. Because of this, the internal strength of the bonding part 41 changes in a substantially continuous manner to make external stress failure unlikely, which can improve the joining strength between the substrate body 10 and the external electrode 50. Specifically, the joining strength between the substrate body 10 and the external electrode 50 can be improved because the bonding part 41 has no part where the concentration of iron increases abruptly, and therefore has no part where its properties change abruptly. When the concentration decreases in a substantially continuous manner, it means the concentration decreases continuously in a range of 80 percent or more of the thickness of the bonding part 41 from the metal magnetic grains 40 to the external electrode 50. How the composition ratio changes in the bonding part 41 from the metal magnetic grains 40 to the external electrode 50 can be calculated by capturing a randomly selected cross-section of where the substrate body 10 and the external electrode 50 are joined using a SEM at a magnification of around 60000 times, and then performing a line analysis on the result based on EDS.

If the metal magnetic grains 40 contain iron, silicon, and a metal that oxidizes more easily than iron, preferably the bonding part 41 positioned between the metal magnetic grains 40 and the external electrode 50 is such that the concentration of the metal that oxidizes more easily than iron is lower than the concentration of iron, but higher than the concentration of oxygen, between its interface with the metal magnetic grains 40 and its interface with the external electrode 50, when the total quantity of iron, silicon, the metal that oxidizes more easily than iron, oxygen, and the metal element in the external electrode 50, represents 100 percent by weight. When the concentration of oxygen is lower as described above, thickening of the bonding part 41 between the metal magnetic grains 40 and the external electrode 50 is inhibited, and thus the joining strength between the substrate body 10 and the external electrode 50 can be improved. In the interest of inhibiting the bonding part 41 between the metal magnetic grains 40 and the external electrode 50 from thickening, the concentration of oxygen in the bonding part 41 between its interface with the metal magnetic grains 40 and its interface with the external electrode 50 is preferably lower than 15 percent by weight, or more preferably lower than 13 percent by weight, or yet more preferably lower than 10 percent by weight.

If the metal magnetic grains 40 contain iron, silicon, and a metal that oxidizes more easily than iron, preferably the bonding part 41 positioned between the metal magnetic grains 40 and the external electrode 50 is such that the concentration of the metal that oxidizes more easily than iron is higher than the concentration of silicon between its interface with the metal magnetic grains 40 and its interface with the external electrode 50, when the total quantity of iron, silicon, the metal that oxidizes more easily than iron, oxygen, and the metal element in the external electrode 50, represents 100 percent by weight. This way, the joining strength between the substrate body 10 and the external electrode 50 can be improved.

If the metal magnetic grains 40 contain iron, silicon, and a metal that oxidizes more easily than iron, preferably the bonding part 41 positioned between the metal magnetic grains 40 and the external electrode 50 is such that the ratio of the concentration of oxygen, to the concentration of the metal that oxidizes more easily than iron, is lower than 2 between its interface with the metal magnetic grains 40 and its interface with the external electrode 50, when the total quantity of iron, silicon, the metal that oxidizes more easily than iron, oxygen, and the metal element in the external electrode 50, represents 100 percent by weight. When the concentration of oxygen is lower as described above, thickening of the bonding part 41 between the metal magnetic grains 40 and the external electrode 50 is inhibited, and thus the joining strength between the substrate body 10 and the external electrode 50 can be improved. In the interest of inhibiting the bonding part 41 between the metal magnetic grains 40 and the external electrode 50 from thickening, the ratio of the concentration of oxygen to the concentration of the metal that oxidizes more easily than iron in the bonding part 41 between its interface with the metal magnetic grains 40 and its interface with the external electrode 50, is more preferably lower than 1.5, or yet more preferably lower than 1.0.

If the metal magnetic grains 40 contain iron, silicon, and a metal that oxidizes more easily than iron, preferably the bonding part 41 between the metal magnetic grains 40 and the external electrode 50 is such that the concentration of the metal that oxidizes more easily than iron is higher than the concentration of oxygen between its interface with the metal magnetic grains 40 and its interface with the external electrode 50, when the total quantity of iron, silicon, the metal that oxidizes more easily than iron, oxygen, and the metal element in the external electrode 50, represents 100 percent by weight. When the concentration of oxygen is lower as described above, thickening of the bonding part 41 between the metal magnetic grains 40 and the external electrode 50 is inhibited, and thus the joining strength between the substrate body 10 and the external electrode 50 can be improved. In the interest of inhibiting the bonding part 41 between the metal magnetic grains 40 and the external electrode 50 from thickening, the concentration of the metal that oxidizes more easily than iron, in the bonding part 41 between its interface with the metal magnetic grains 40 and its interface with the external electrode 50, is more preferably 1.2 times or higher, or yet more preferably 1.3 times or higher, than the concentration of oxygen.

If the metal magnetic grains 40 contain iron, silicon, and a metal that oxidizes more easily than iron, preferably the bonding part 41 between the metal magnetic grains 40 and the external electrode 50 is such that an EDS surface analysis of 20 of the metal magnetic grains 40 will not detect any part of its interface with the metal magnetic grains 40 where the concentration of silicon is 10 percent by weight or higher, when the total quantity of iron, silicon, the metal that oxidizes more easily than iron, oxygen, and the metal element in the external electrode 50, represents 100 percent by weight. When a lot of glass component is present in the bonding part between the metal elements constituting the magnetic grains and external electrode, the differences between the coefficients of linear expansion of the metal parts (iron, chromium) constituting the metal magnetic grains and metal (silver) constituting the external electrode, and the coefficient of linear expansion of the glass part whose key constituents are silicon oxides, become greater and the external electrode peels easily due to temperature change. According to the aforementioned constitution, however, the bonding part 41 between the metal magnetic grains 40 and the external electrode 50 has little glass component, and therefore peeling of the external electrode 50 can be inhibited. In the interest of inhibiting the external electrode 50 from peeling, the bonding part 41 between the metal magnetic grains 40 and the external electrode 50 is such that more preferably an EDS surface analysis of 20 of the metal magnetic grains 40 will not detect any part of its interface with the metal magnetic grains 40 where the concentration of silicon is 7 percent by weight or higher, or yet more preferably it will not detect any part where the concentration is 4 percent by weight or higher.

Over the entire range of a square whose one side is ⅓d and which is located at a randomly selected position in a region, of the external electrode 50, away by at least ½d from an outer surface of the bonding part 41 formed between the metal magnetic grains 40 and the external electrode 50, toward an external surface side of the external electrode 50, where d represents the thickness of the external electrode 50 (constituted by a single layer having continuity of compositions, excluding a plated metal layer or the like), preferably the concentration of the metal element in the external electrode 50 is 90 percent by weight or higher, while the concentration of silicon as a glass component is lower than 1 percent by weight. It can be assumed that, even if silicon is contained in the metal magnetic grains 40, for example, silicon will practically never move such distance as to reach a location away from the bonding part 41 on the metal magnetic grains 40 surface, by at least one-half the thickness of the external electrode 50, toward the external surface side (opposite to the side facing the bonding part) of the external electrode 50. Accordingly, any silicon present in this location is assumed to be silicon originating in the external electrode contained as a glass component. This mode can be achieved by making the external electrode 50 substantially glass-free.

If the external electrode 50 contains glass, glass remains uniformly distributed over the metal magnetic grains immediately after a conductive paste for the external electrode 50 has been applied. As the conductive paste for the external electrode 50 is baked (sintered), however, glass moves toward the surface side of the external electrode 50 and aggregates there. At this time, moving of glass that originally existed at the interface between the oxide layer and the external electrode 50 facilitates growth of the oxide layer in the affected part. This is likely because the oxygen in the voids out of which glass has moved oxidizes the metal magnetic grains 40. By contrast, when the concentration, in the external electrode 50, of the metal element constituting the external electrode 50 is 90 percent by weight or higher and that of silicon as a glass component is lower than 1 percent by weight, thickening of the bonding part 41 between the metal magnetic grains 40 and the external electrode 50 is inhibited and therefore the joining strength between the substrate body 10 and the external electrode 50 can be improved. Additionally, the electrical resistance of the external electrode 50 can be reduced because there is less glass component in the external electrode 50. The glass component is primarily silicon, but it may also contain sodium (Na), boron (B), aluminum (Al), titanium (Ti), barium (Ba), zinc (Zn), calcium (Ca), etc., as additives. In the present invention, it is assumed that the concentration of the glass component equals the concentration of silicon. In the interest of inhibiting the bonding part 41 between the metal magnetic grains 40 and the external electrode 50 from thickening, the concentration, in the external electrode 50, of the metal element constituting the external electrode 50 is more preferably 92 percent by weight or higher, or yet more preferably 94 percent by weight or higher. The concentration of the glass component is more preferably lower than 0.8 percent by weight, or yet more preferably lower than 0.6 percent by weight.

Preferably the bonding part 41 between the metal magnetic grains 40 and the external electrode 50 has a thickness of 10 nm or greater but no greater than 100 nm over the shortest distance between the metal magnetic grains 40 and the external electrode 50. This inhibits the bonding part 41 from becoming excessively thin and thus causing the joining strength between the substrate body 10 and the external electrode 50 to drop, or the bonding part 41 from becoming excessively thick and thus causing the joining strength between the substrate body 10 and the external electrode 50 to drop. In the interest of inhibiting the joining strength of the external electrode 50 from dropping, the thickness of the bonding part 41 between the metal magnetic grains 40 and the external electrode 50, over the shortest distance between the metal magnetic grains 40 and the external electrode 50, is more preferably 15 nm or greater but no greater than 60 nm, or yet more preferably 15 nm or greater but no greater than 30 nm.

While the first aspect illustrated an example where the external electrodes 50, 51 are single-side electrodes provided only on the bottom face of the substrate body 10, this is not necessarily the case. When the faces that connect the short sides of the bottom face of the substrate body 10 to the short sides of the top face of the substrate body 10 are called "end faces" of the substrate body 10, while the faces that connect the long sides of the bottom face of the substrate body 10 to the long sides of the top face of the substrate body 10 are called "side faces" of the substrate body 10, the external electrodes 50, 51 may be L-shaped electrodes extending from the bottom face, to an end face, of the substrate body 10, or U-shaped electrodes extending from the bottom face, via an end face, to the top face, of the substrate body 10, or five-sided electrodes extending from the bottom face, to an end face and also to the top face contacting the end face, as well as to the two side faces, of the substrate body 10. External electrodes on the top face may be produced according to the same procedure that applies to those on the bottom face. Electrodes on the end faces and side faces may be produced by cutting the compression-bonded body into individual chips and then applying a conductive paste that contains a silver powder or other metal powder but contains virtually no glass frit, followed by drying of the paste with a hot-air dryer or other dryer. If the external electrodes 50, 51 are shaped not as one-sided electrodes, but as L-shaped electrodes, U-shaped electrodes or five-sided electrodes, for example, it is sufficient that the bonding part 41 between the metal magnetic grains 40 and the external electrode 50 satisfies what is described above at least on the bottom face of the substrate body 10.

While the first aspect illustrated an example where the coil component is a multilayer inductor in which multiple magnetic layers are stacked and a coil conductor is built into the resulting substrate body, this is not necessarily the case. For example, it may be a coil component constituted by a drum core or other substrate body with a coil conductor wound around the surface thereof.

[Second Aspect]

Figure 4:
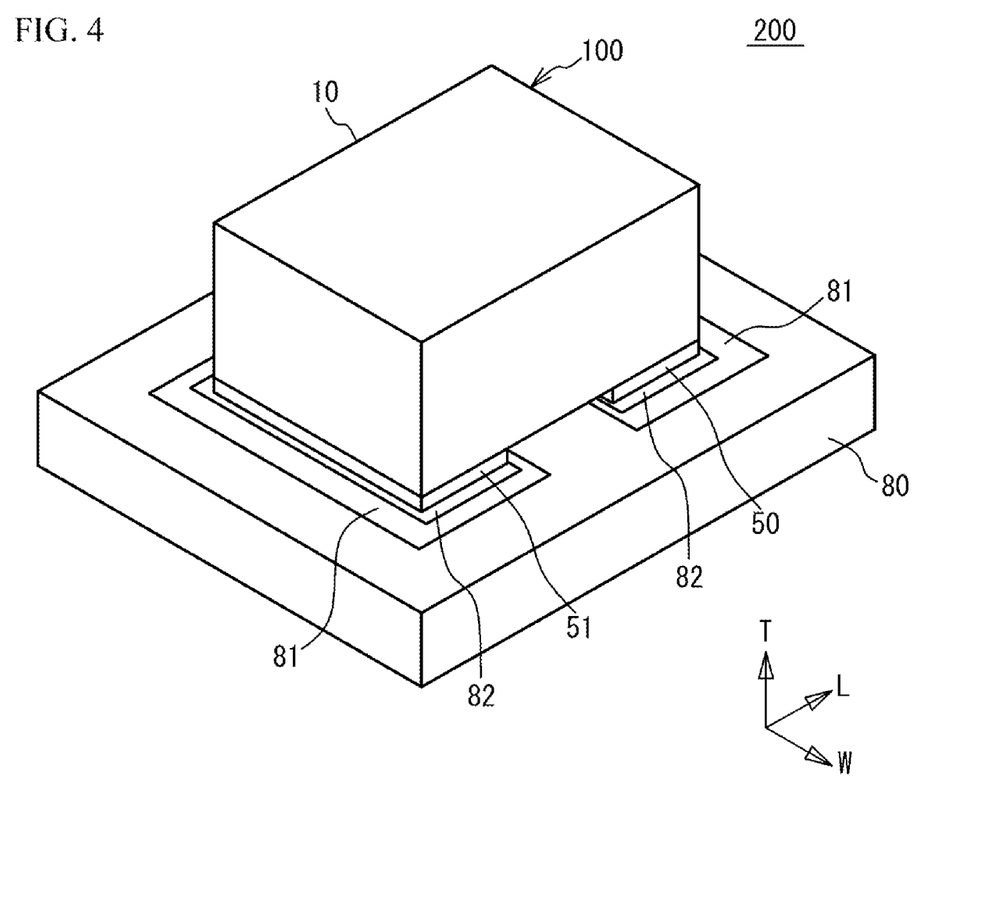
FIG. 4 is a perspective view showing the electronic device pertaining to the second aspect of the invention under the present application for patent.

FIG. 4 is a perspective view showing the electronic device pertaining to the second aspect of the invention under the present application for patent. With reference to FIG. 4, the electronic device 200 comprises a circuit board 80 and the coil component 100 mounted on the circuit board 80. The coil component 100 is mounted on the circuit board 80 by joining its external electrodes 50, 51 to electrodes 81 on the circuit board 80 via a solder 82 (solder frit is not illustrated). This way, the electronic device 200 comprising the coil component 100 whose joining strength between the substrate body 10 and the external electrodes 50, 51 has been improved, can be obtained.

EXAMPLES

The invention under the present application for patent is explained more specifically below using an Example and a Comparative Example; it should be noted, however, that the invention under the present application for patent is not limited to the modes described in these examples.

Example

The coil component in the Example was produced according to the following method. By using an alloy powder whose composition ratios of material grains are 6.5 percent by weight of silicon, 1.5 percent by weight of chromium, and iron accounting for the remainder, a magnetic paste containing this alloy powder, toluene (solvent), and polyvinyl butyral (binder) was prepared. This magnetic paste was applied on the surfaces of base films according to the doctor blade method, and then dried using a hot-air dryer, to form magnetic films on the base films. Next, at prescribed positions on the magnetic films, through holes were formed using a laser, after which a first conductive paste containing a silver powder, butyl carbitol (solvent), and ethyl cellulose (binder) was printed on the surfaces of the magnetic films and then dried using a hot-air dryer, to form precursors to conductor patterns and vias. Next, the aforementioned magnetic paste was applied on the magnetic films and then dried using a hot-air dryer, to form magnetic films around the conductor patterns. Thereafter, the base films were peeled, to form magnetic layers on which conductor patterns and vias have been provided.

The aforementioned magnetic paste was applied on the surfaces of base films according to the doctor blade method, and then dried using a hot-air dryer, to form magnetic films on the base films. If necessary, each magnetic film was pierced at prescribed positions using a laser, and then the aforementioned first conductive paste was printed on the surfaces of the magnetic films and then dried using a hot-air dryer, to form precursors to vias. Thereafter, the base films were peeled, to form a cover layer on which vias are provided, and a cover layer on which no vias are provided.

A second conductive paste containing a silver powder, butyl carbitol, and ethyl cellulose but containing substantially no glass frit (negligible or immaterial amount, non-detectable amount, or amount of unavoidable or incidental or migrated impurity/contaminant) was applied on a base film, and then dried using a hot-air dryer or other dryer, to form precursors to external electrodes. On top of the above, the aforementioned magnetic paste was applied and then dried using a dryer, to form a magnetic film with external electrodes embedded in it. The magnetic film was pierced at prescribed positions using a laser, after which the aforementioned first conductive paste was applied and then dried using a hot-air dryer or other dryer, to form precursors to vias. Thereafter, the base film was peeled, to form an electrode-containing layer.

The magnetic layers, cover layers, and electrode-containing layer were stacked in a prescribed order, and the resulting laminated body was compression-bonded at a pressure of 10 MPa. The compression-bonded body was cut into individual chips, which were given a binder-removal treatment, etc., and then heat-treated for 1 hour at 800° C. in an oxygen-containing atmosphere. This way, a substrate body 10 with a built-in coil conductor 30 and having external electrodes 50, 51 provided on its surface, was obtained. Thereafter, the external electrodes 50, 51 were plated to form a nickel-tin coating thereon.

COMPARATIVE EXAMPLE

The coil component in the Comparative Example was produced according to the same method by which the coil component in the Example was produced, except that, when the electrode-containing layer was formed, a third conductive paste containing a silver powder, butyl carbitol, ethyl cellulose, and glass frit was used to form precursors to external electrodes.

The coil component in the Example, and coil component in the Comparative Example, were each adjusted to have a length dimension of 2.0 mm, a width dimension of 1.6 mm, and a thickness dimension of 0.8 mm. The width dimensions of the external electrodes in the length direction of the coil component were each adjusted to 0.5 mm.

[Evaluation of Where Substrate Body and External Electrode Are Joined]

The coil component in the Example, and coil component in the Comparative Example, were evaluated by SEM and EDS over where the substrate body and an external electrode were joined.

Figure 5A:
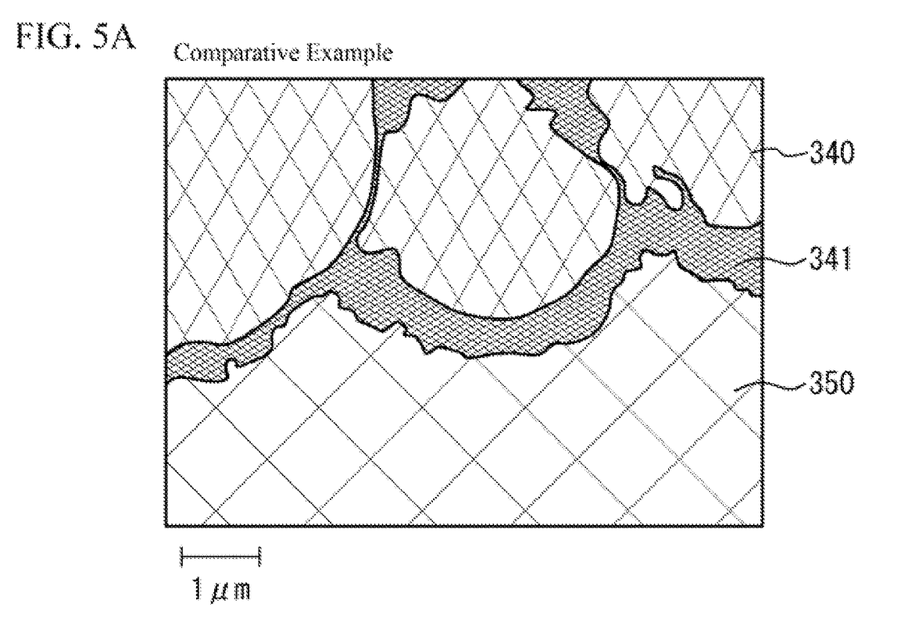
FIG. 5A is a schematic view, based on a scanning electron microscope image, of the coil component in the Comparative Example.
Figure 5B:
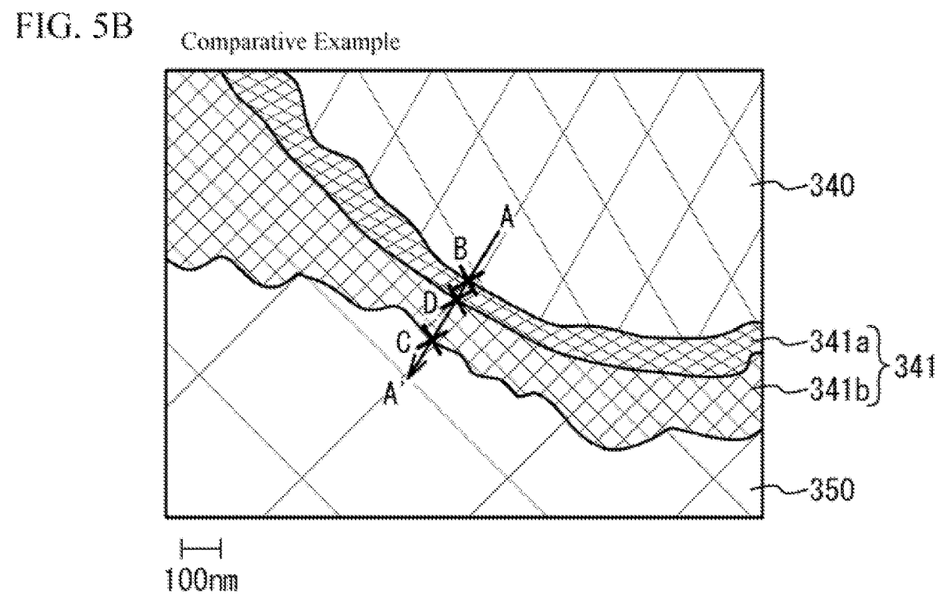
FIG. 5B is an enlarged view of a part of FIG. 5A.

FIG. 5A is a schematic view, based on a SEM image, of the coil component in the Comparative Example, and FIG. 5B is an enlarged view of a part of FIG. 5A. As shown in FIGS. 5A and 5B, an oxide layer 341 comprising a first oxide layer 341a and a second oxide layer 341b is present between metal magnetic grains 340 constituting the substrate body, and an external electrode 350. The first oxide layer 341a covers the surfaces of the metal magnetic grains 340. The second oxide layer 341b is positioned between the first oxide layer 341a and the external electrode 350 and is thicker than the first oxide layer 341a.

Figure 6A:
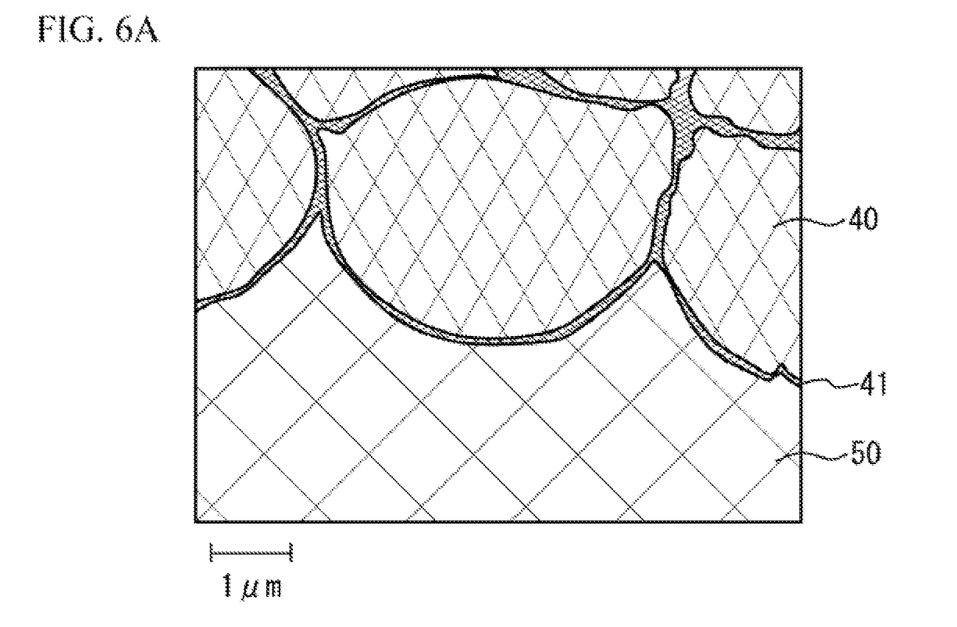
FIG. 6A is a schematic view, based on a scanning electron microscope image, of the coil component in the Example.
Figure 6B:
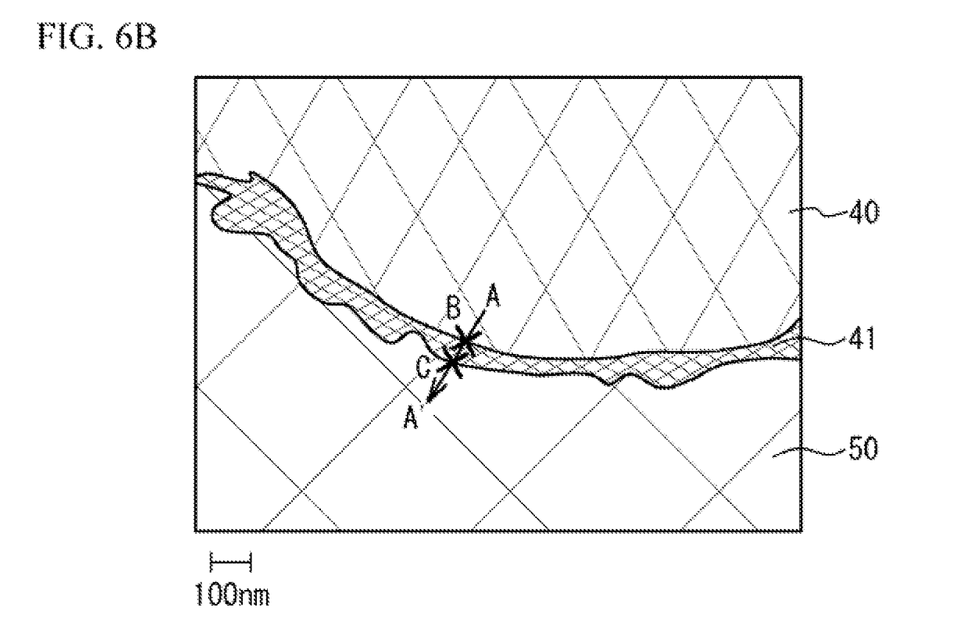
FIG. 6B is an enlarged view of a part of FIG. 6A.

FIG. 6A is a schematic view, based on a SEM image, of the coil component in the Example, and FIG. 6B is an enlarged view of a part of FIG. 6A. As shown in FIGS. 6A and 6B, a bonding part 41 is present between the metal magnetic grains 40 constituting the substrate body, and the external electrode 50. The bonding part 41 covers the surfaces of the metal magnetic grains 40.

In the case of the coil component in the Comparative Example, it is assumed that the use of the third conductive paste containing glass frit in the forming of the external electrode 350 caused the oxide layer 341 between the metal magnetic grains 340 and the external electrode 350 to have a double-layer structure consisting of the first oxide layer 341a and the second oxide layer 341b, and therefore become thick. In other words, when the external electrode 350 contains glass, it is uniformly distributed over the metal magnetic grains immediately after the conductive paste for the external electrode 350 has been applied; as the conductive paste for the external electrode 350 is baked (sintered), however, the glass moves toward the surface side of the external electrode 350 and aggregates there. At this time, moving of glass that originally existed at the interface between the oxide layer 341 (first oxide layer 341a) and the external electrode 350 facilitates growth of the oxide layer 341 (second oxide layer 341b) in the parts out of which the glass has moved. This is likely because the oxygen in the voids that were created by the moving of the glass oxidizes the metal magnetic grains 340. This is likely why the oxide layer 341 between the metal magnetic grains 340 and the external electrode 350 became thicker in the coil component in the Comparative Example. In the case of the coil component in the Example, on the other hand, it is assumed that the use of the second conductive paste not containing glass frit in the forming of the external electrode 50 caused the bonding part 41 between the metal magnetic grains 40 and the external electrode 50 to have a single-layer structure (corresponding only to the first oxide layer 341a) in which no layer has grown that corresponds to the second oxide layer 341b, and therefore become thin.

FIGS. 7A to 7E are schematic views, based on EDS surface analysis images, of the coil component in the Comparative Example. FIGS. 7A to 7E map the K-lines of silicon (Si), chromium (Cr), oxygen (O), and iron (Fe), and L-line of silver (Ag), respectively, at the same position as in in FIG. 5A. Hatched regions represent regions where the applicable elements are contained in large quantities, indicating that the contents of the applicable elements are higher in the darkly hatched regions than in the lightly hatched regions.

Figure 7A:
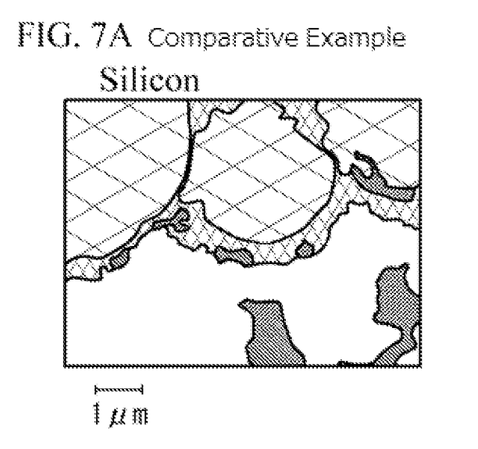
FIGS. 7A to 7E are schematic views, based on surface analysis images according to energy dispersive X-ray spectroscopy, of the coil component in the Comparative Example.
Figure 7B:
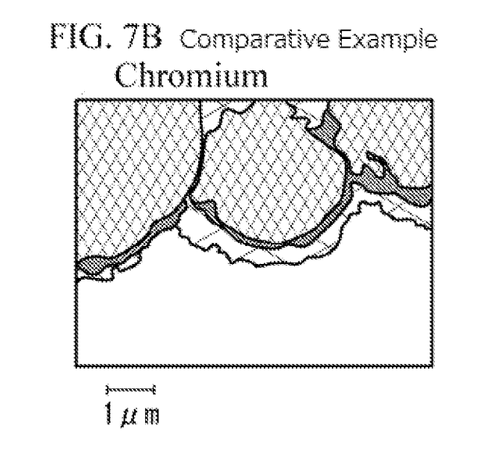
Figure 7C:
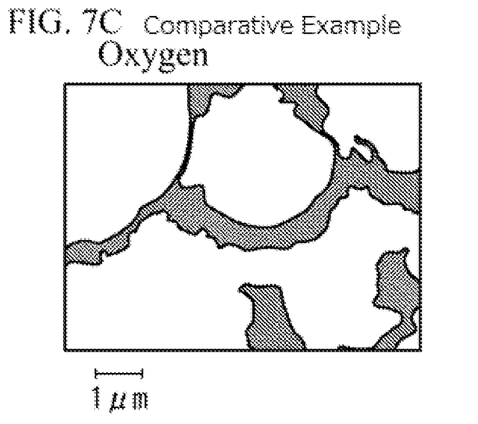
Figure 7D:
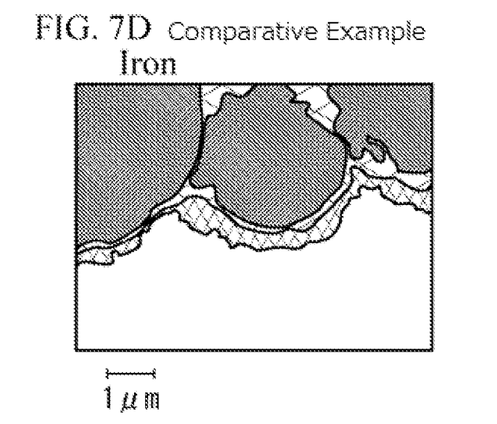
Figure 7E:
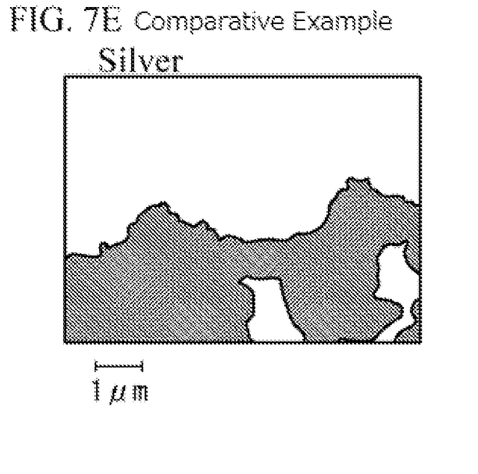

With reference to FIGS. 5A, 5B, and 7A, silicon is distributed in the metal magnetic grains 340 and at the surfaces of the metal magnetic grains 340, and also abundantly in the oxide layer 341 between the metal magnetic grains 340 and the external electrode 350. There is more silicon in the first oxide layer 341a and second oxide layer 341b than in/on the metal magnetic grains 340. Also, a lot of silicon is distributed locally in the external electrode 350. Hardly any silicon is distributed in locations where a lot of silver is distributed. With reference to FIGS. 5A, 5B, and 7B, chromium is distributed in the metal magnetic grains 340, and also abundantly at the surfaces of the metal magnetic grains 340. Chromium is found more in the first oxide layer 341a than in the metal magnetic grains 340, but less in the second oxide layer 341b than in the metal magnetic grains 340. Hardly any chromium is distributed in the external electrode 350. With reference to FIGS. 5A, 5B, and 7C, hardly any oxygen is distributed in the metal magnetic grains 340, but it is distributed abundantly at the surfaces of the metal magnetic grains 340. In other words, oxygen is distributed abundantly in the oxide layer 341 between the metal magnetic grains 340 and the external electrode 350. A lot of oxygen is also distributed locally in the external electrode 350. Hardly any oxygen is distributed in locations where a lot of silver is distributed. With reference to FIGS. 5A, 5B, and 7D, iron is distributed abundantly in the metal magnetic grains 340 and at the surfaces of the metal magnetic grains 340. Iron is found more in the metal magnetic grains 340 than in the first oxide layer 341a and second oxide layer 341b, and less in the first oxide layer 341a than in the second oxide layer 341b. Hardly any iron is distributed in the external electrode 350. With reference to FIGS. 5A, 5B, and 7E, silver is distributed abundantly in the external electrode 350, but there is hardly any distribution in the metal magnetic grains 340 or in the first oxide layer 341a and second oxide layer 341b.

FIGS. 8A to 8E are schematic views, based on EDS surface analysis images, of the coil component in the Example. FIGS. 8A to 8E map the K-lines of silicon (Si), chromium (Cr), oxygen (O), iron (Fe), and L-line of silver (Ag), respectively, at the same position as in FIG. 6A. Hatched regions represent regions where the applicable elements are contained in large quantities, indicating that the contents of the applicable elements are higher in the darkly hatched regions than in the lightly hatched regions.

Figure 8A:
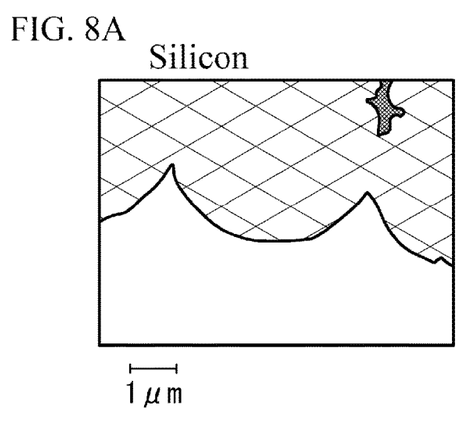
FIGS. 8A to 8E are schematic views, based on surface analysis images according to energy dispersive X-ray spectroscopy, of the coil component in the Example.
Figure 8B:
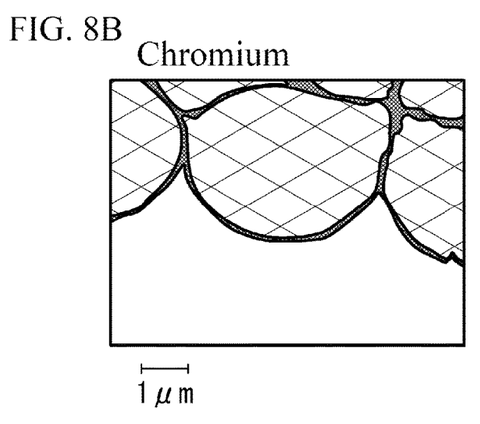
Figure 8C:
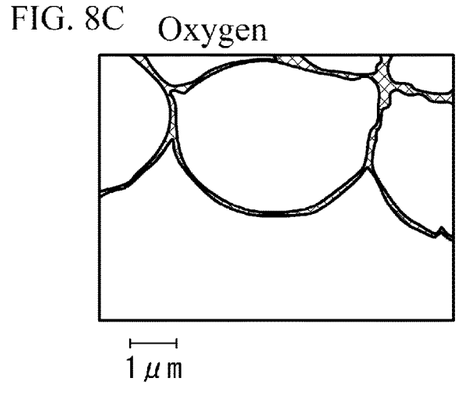
Figure 8D:
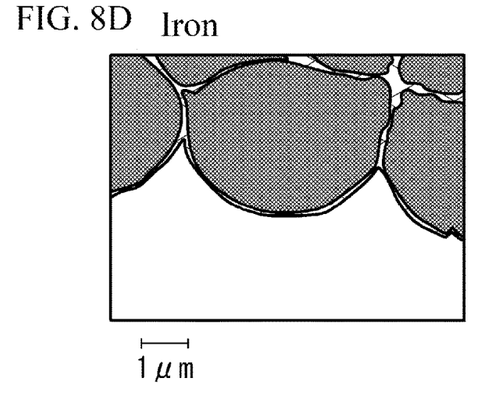
Figure 8E:
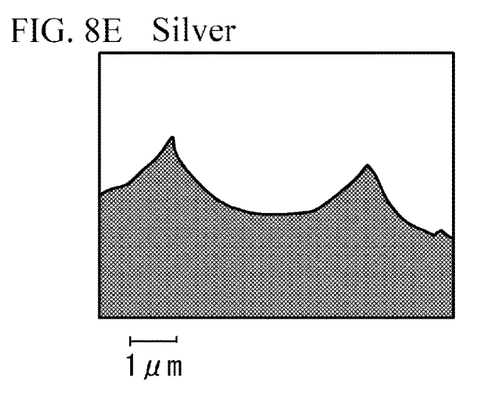

As shown in FIGS. 6A, 6B, and 8A, silicon is distributed in the metal magnetic grains 40 and at the surfaces of the metal magnetic grains 40, and also in the bonding part 41 between the metal magnetic grains 40 and the external electrode 50. Hardly any silicon is distributed in the external electrode 50. As shown in FIGS. 6A, 6B, and 8B, chromium is distributed in the metal magnetic grains 40, and also abundantly at the surfaces of the metal magnetic grains 40. In other words, chromium is found more in the bonding part 41 than in the metal magnetic grains 40. Hardly any chromium is distributed in the external electrode 50. As shown in FIGS. 6A, 6B, and 8C, hardly any oxygen is distributed in the metal magnetic grains 40, and there is only a little distribution at the surfaces of the metal magnetic grains 40. In other words, oxygen is distributed in the bonding part 41, but in small quantities. Also, hardly any oxygen is distributed in the external electrode 50. As shown in FIGS. 6A, 6B and 8D, iron is distributed abundantly in the metal magnetic grains 40, and there is some distribution at the surfaces of the metal magnetic grains 40. In other words, iron is also distributed in the bonding part 41. Hardly any iron is distributed in the external electrode 50. As shown in FIGS. 6A, 6B and 8E, silver is distributed abundantly in the external electrode 50, but there is hardly any distribution in the metal magnetic grains 40 or in the bonding part 41.

In summary, in the Example, the bonding part 41 is a thin layer consisting of only a single layer, wherein, specifically, the bonding part 41 is constituted by an oxide layer containing more chromium than do the metal magnetic grains 40 parts. Another characteristic is that hardly any silicon, as a glass component, is distributed in the external electrode 50. In the Comparative Example, by contrast, the oxide layer 341 has a double-layer structure consisting of the thin first oxide layer 341a on the interior side (magnetic grains 340 side) and the thick second oxide layer 341b on the exterior side (toward the exterior electrode), wherein the first oxide layer 341a on the interior side contains more silicon and chromium than do the metal magnetic grains 340 parts, while the second oxide layer 341b on the exterior side contains more silicon than do the metal magnetic grains 340 parts, but less chromium than do the metal magnetic grains 340 parts. Also, silicon as a glass component is locally present in the external electrode 350.

[Evaluation of Bonding Part and Oxide Layer]

The coil component in the Example, and coil component in the Comparative Example, were evaluated by EDS on how the composition ratios of the bonding part and oxide layer positioned between the metal magnetic grains and the external electrodes, change from the metal magnetic grains to the external electrodes.

Figure 9A:
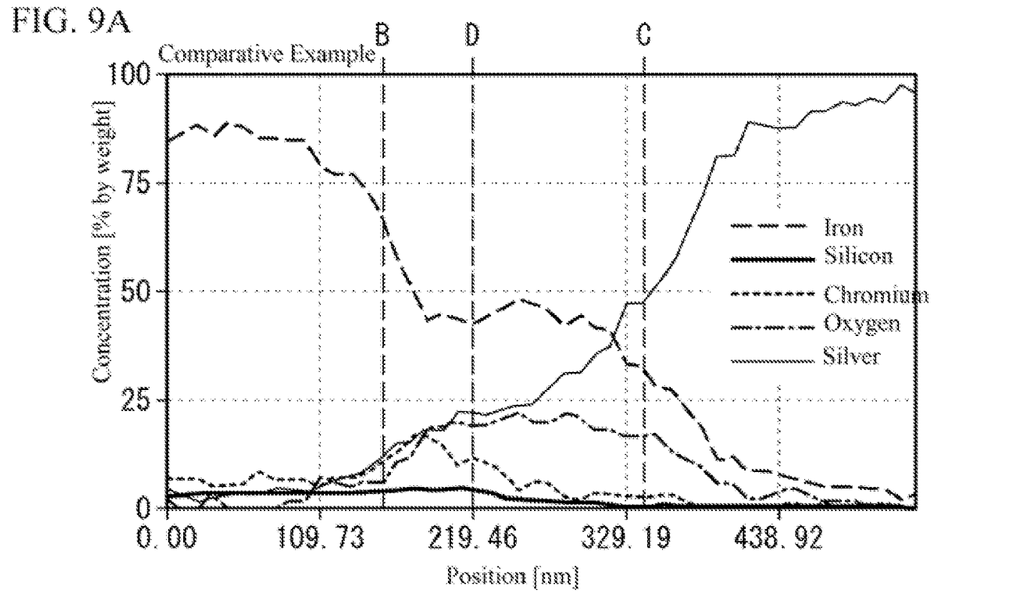
FIG. 9A is a chart showing the result of a line analysis, based on energy dispersive X-ray spectroscopy, conducted in the direction of the arrow covering A to A' in FIG. 5B.
Figure 9B:
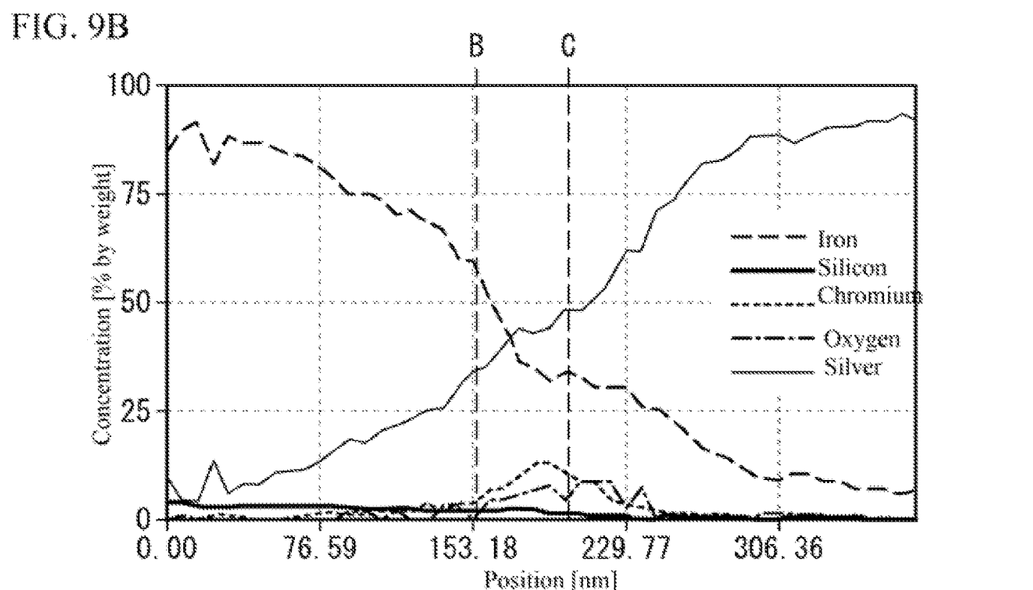
FIG. 9B is a chart showing the result of a line analysis, based on energy dispersive X-ray spectroscopy, conducted in the direction of the arrow covering A to A' in FIG. 6B.

FIG. 9A is a chart showing the result of a line analysis, based on EDS, conducted in the direction of the arrow covering A to A' in FIG. 5B representing the Comparative Example, and FIG. 9B is a chart showing the result of a line analysis, based on EDS, conducted in the direction of the arrow covering A to A' in FIG. 6B representing the Example. FIGS. 9A and 9B show the concentration of each of iron, silicon, chromium, oxygen, and silver based on their total quantity representing 100 percent by weight. In FIGS. 9A, B, C, and D indicate the positions of the interface B between the metal magnetic grains 340 and the first oxide layer 341a, interface C between the second oxide layer 341b and the external electrode 350, and interface D between the first oxide layer 341a and the second oxide layer 341b, in FIG. 5B. In FIGS. 9B, B and C indicate the positions of the interface B between the metal magnetic grains 40 and the bonding part 41, and interface C between the bonding part 41 and the external electrode 50, in FIG. 6B. Positions of the interfaces can be recognized as contrast (brightness) differences on an image of a cross-section of where the substrate body 10 and the external electrode 50 are joined, captured by a SEM at a magnification of around 60000 times, for example.

As shown in FIG. 9A, the coil component in the Comparative Example is such that, while the concentration of iron decreases in a substantially continuous manner between the positions B and D where the first oxide layer 341a is positioned, the concentration of iron increases and then decreases between the positions D and C where the second oxide layer 341b is positioned. In other words, the oxide layer 341 positioned between the metal magnetic grains 340 and the external electrode 350 has parts where the concentration of iron increases between the metal magnetic grains 340 and the external electrode 350. Since the concentration of oxygen is high between the positions D and C, the second oxide layer 341b is confirmed to be a layer that contains a lot of iron oxides. Also, the concentration of chromium increases and then decreases in the first oxide layer 341a positioned between the positions B and D, while the concentration of chromium decreases in a substantially continuous manner in the second oxide layer 341b positioned between the positions D and C. The thickness of the first oxide layer 341a is approx. 60 to 70 nm, while the thickness of the second oxide layer 341b is approx. 110 to 120 nm.

On the other hand, as shown in FIG. 9B, the coil component in the Example is such that the concentration of iron decreases in a substantially continuous manner between the positions B and C where the bonding part 41 is positioned. This means that, in the bonding part 41 positioned between the metal magnetic grains 40 and the external electrode 50, the concentration of iron decreases in a substantially continuous manner from the metal magnetic grains 40 to the external electrode 50. Also, in the bonding part 41, the concentration of chromium increases and then decreases. The thickness of the bonding part 41 is approx. 40 to 50 nm.

In summary, while the concentration of iron decreases in a substantially continuous manner in the bonding part 41 part in the Example, it does not decrease in a substantially continuous manner across the entire oxide layer 341 in the Comparative Example, decreasing in the first oxide layer 341a part on the interior side, but increasing first and then decreasing in the second oxide layer 341b part on the exterior side.

[Adhesion Test]

An adhesion test was conducted on 22 coil components conforming to the coil component in the Example, and another 22 conforming to the Comparative Example. The adhesion test was conducted according to the following method. First, the external electrodes of the coil components conforming to the Example, and coil components conforming to the Comparative Example, were joined by a solder to the land electrodes on mounting boards, to mount the coil components on the surfaces of the mounting boards. To each of the coil components mounted on the surfaces of the mounting boards, a load was applied at a rate of 2.5 mm/min in the direction parallel to the surface of the mounting board, and the adhesion strength of the coil component to the mounting board was measured. The land electrodes were shaped as a rectangle with a length dimension of 1.6 mm and a width dimension of 0.5 mm. The spacing between the two land electrodes to which the two external electrodes of a coil component were respectively joined, was set to 1.0 mm. The thickness of the solder joining an external electrode and a land electrode was set to 0.12 mm.

The obtained results are shown in Table 1.

TABLE 1

|  | Adhesion strength [N] | | |
| --- | --- | --- | --- |
|  | Average value | Maximum value | Minimum value |
| Comparative Example | 32 | 39 | 25 |
| Example | 57 | 70 | 43 |

As shown in Table 1, the maximum value, minimum value, and average value of the adhesion strengths of the external electrodes 350 of the coil components conforming to the Comparative Example were 39 N, 25 N, and 32 N, respectively. On the other hand, the maximum value, minimum value, and average value of the adhesion strengths of the external electrodes 50 of the coil components conforming to the Example were 70 N, 43 N, and 57 N, respectively. The higher adhesion strengths in the Example than in the Comparative Example are likely explained by the following reason. It is shown in FIGS. 9A and 9B that, while the oxide layer positioned between the metal magnetic grains and the external electrodes have parts where the concentration of iron increases between the metal magnetic grains and the external electrodes in the Comparative Example, the concentration of iron decreases in a substantially continuous manner in the bonding part positioned between the metal magnetic grains and the external electrodes, from the metal magnetic grains to the external electrodes in the Example. This is why, as shown in FIGS. 5A, 5B, 6A, and 6B, the bonding part positioned between the metal magnetic grains and the external electrodes is thinner in the Example than in the Comparative Example. It is therefore assumed that, in the Example, the bonding part that can cause failure in the adhesion test was thinner, and thus the adhesion strength became greater, than in the Comparative Example. In other words, when the concentration of iron changes smoothly inside the bonding part from the metal magnetic grains toward the external electrodes, it means that the strength of the bonding part changes smoothly. By contrast, when the concentration of iron increases and decreases inside the oxide layer from the metal magnetic grains toward the external electrodes, as in the Comparative Example, it means that the strength of the oxide layer increases and decreases. When an external stress is applied, the stress will be dispersed over the entire bonding part if the strength of the bonding part changes smoothly, as in the Example. By contrast, if the strength of the oxide layer increases and decreases, as in the Comparative Example, an external stress tends to concentrate in the affected parts where the strength changes, and because these parts can each cause failure, the strength of the oxide layer will decrease. Preferably there is no part in the oxide layer where its strength increases and decreases, because if there is such a part, the oxide layer becomes thicker by the thickness of the strength-changing part, which makes the oxide layer vulnerable to internal failure. It is assumed that, for these reasons, sufficient joining strength could not be achieved between the substrate body and the external electrodes in the Example due to the property of the bonding part.

The above results confirm that, when the concentration of iron in the bonding part 41 between the metal magnetic grains 40 and the external electrode 50 decreases in a substantially continuous manner from the metal magnetic grains 40 to the external electrode 50, the bonding part 41 between the metal magnetic grains 40 and the external electrode 50 becomes thinner and the joining strength of the external electrode 50 improves.

As shown in FIG. 9B, the bonding part 41 between the metal magnetic grains 40 and the external electrode 50, as positioned between the positions B and C, is such that, when the total quantity of iron, silicon, chromium, oxygen, and silver represents 100 percent by weight, the concentration of chromium is lower than the concentration of iron, but higher than the concentration of oxygen, from its interface with the metal magnetic grains 40 (position B) to its interface with the external electrode 50 (position C). This confirms that, when such is the case, the bonding part 41 between the metal magnetic grains 40 and the external electrode 50 becomes thin and the joining strength of the external electrode 50 improves as a result. Also, the bonding part 41 between the metal magnetic grains 40 and the external electrode 50, as positioned between the positions B and C, is such that, when the total quantity of iron, silicon, chromium, oxygen, and silver represents 100 percent by weight, the concentration of chromium is higher than the concentration of silicon from its interface with the metal magnetic grains 40 (position B) to its interface with the external electrode 50 (position C). This confirms that, when such is the case, the bonding part 41 between the metal magnetic grains 40 and the external electrode 50 becomes thin and the joining strength of the external electrode 50 improves as a result. Additionally, the bonding part 41 between the metal magnetic grains 40 and the external electrode 50, as positioned between the positions B and C, is such that, when the total quantity of iron, silicon, chromium, oxygen, and silver represents 100 percent by weight, the ratio of the concentration of oxygen to the concentration of chromium is lower than 2 from its interface with the metal magnetic grains 40 (position B) to its interface with the external electrode 50 (position C). This confirms that, when such is the case, the bonding part 41 between the metal magnetic grains 40 and the external electrode 50 becomes thin and the joining strength of the external electrode 50 improves as a result.

Furthermore, as shown in FIG. 9B, the bonding part 41 between the metal magnetic grains 40 and the external electrode 50, as positioned between the positions B and C, is such that, when the total quantity of iron, silicon, chromium, oxygen, and silver represents 100 percent by weight, the concentration of chromium is higher than the concentration of oxygen in a region from its interface with the metal magnetic grains 40 (position B) to its interface with the external electrode 50 (position C). This confirms that, when such is the case, the bonding part 41 between the metal magnetic grains 40 and the external electrode 50 becomes thin and the joining strength of the external electrode 50 improves as a result. Also, over the entire range of a square whose one side is ⅓d and which is located at an arbitrary position in a region, within the external electrode 50, away by at least ½d from the interface of the bonding part 41 with the external electrode 50 (position C) toward an external surface side of the external electrode 50, where d represents the thickness of a portion of the external electrode 50 which is constituted by a single layer facing the bonding part 41 and having continuity of compositions in a thickness direction (exclusive of other layers such as a plated metal layer), the concentration of silver in the external electrode 50 (the metal element of the external electrode) is 90 percent by weight or higher, while the concentration of a glass component is lower than 1 percent by weight. This confirms that, when such is the case, the bonding part 41 between the metal magnetic grains 40 and the external electrode 50 becomes thin and the joining strength of the external electrode 50 improves as a result.

As shown in FIGS. 5A and 7A, the coil component in the Comparative Example is such that, in the oxide layer 341 between the metal magnetic grains 340 and the external electrode 350, an EDS surface analysis detected parts of its interface with the metal magnetic grains 340 where the concentration of silicon is 10 percent by weight or higher, when the total quantity of iron, silicon, chromium, oxygen, and silver represents 100 percent by weight. As a result, it can be said that for the coil component in the Comparative Example whose external electrode 350 is formed with glass frit, the concentration of silicon in regions in the external electrode 350 where silicon is locally more distributed is approx. 10 percent by weight or higher. In view of the above, it can be said that for the coil component in the Comparative Example, the oxide layer 341 between the metal magnetic grains 340 and the external electrode 350 is such that an EDS surface analysis found parts of its interface with the metal magnetic grains 340 where the concentration of silicon was 10 percent by weight or higher.

By contrast, as shown in FIGS. 6A and 8A, it can be confirmed that, as for the coil component in the Example, the bonding part 41 between the metal magnetic grains 40 and the external electrode 50 is such that, when the total quantity of iron, silicon, chromium, oxygen, and silver represents 100 percent by weight, an EDS surface analysis of 20 of the metal magnetic grains 40 did not detect any part of its interface with the metal magnetic grains 40 where the concentration of silicon was 10 percent by weight or higher. In this case, the scarcity of glass component in the bonding part 41 part at its interface with the metal magnetic grains 40 decreases the differences between the coefficients of linear expansion of the metal parts (iron, chromium) constituting the metal magnetic grains and metal (silver) constituting the external electrode, and the coefficient of linear expansion of the glass part whose key constituents are silicon oxides, and consequently peeling of the external electrode 50 due to temperature change can be inhibited.

The foregoing discussed an embodiment of the invention under the present application for patent in detail; however, the invention under the present application for patent is not limited to such specific embodiment and various modifications and changes may be added to the extent that doing so does not deviate from the key points of the invention under the present application for patent as explicitly, implicitly, or inherently described herein.

We claim:

1. A coil component comprising:
   a substrate body containing: metal magnetic grains whose primary component is iron and which contains silicon and a metal that oxidizes more easily than iron; and an oxide layer covering surfaces of the metal magnetic grains and joining multiple numbers of the metal magnetic grains together;
   a coil conductor provided in the substrate body;
   external electrodes provided on a surface of the substrate body and electrically connected to the coil conductor; and
   a bonding part located between, as an adhesive, and bonding the metal magnetic grains and the external electrodes, wherein a concentration of iron decreases continuously in a range of 80 percent or more of a thickness of the bonding part from an interface region with the metal magnetic grains to an interface region with the external electrodes,
   wherein the bonding part between the metal magnetic grains and the external electrodes is such that a concentration by weight of the metal that oxidizes more easily than iron is lower than a concentration by weight of iron, but higher than a concentration by weight of oxygen, throughout the bonding part in a thickness direction entirely from the interface region with the metal magnetic grains to the interface region with the external electrodes.

2. The coil component according to claim 1, wherein the bonding part between the metal magnetic grains and the external electrodes is such that a concentration by weight of the metal that oxidizes more easily than iron is higher than a concentration by weight of silicon between its interface with the metal magnetic grains and its interface with the external electrodes.

3. The coil component according to claim 1, wherein the bonding part between the metal magnetic grains and the external electrodes is such that, when a total quantity of elements consisting of iron, silicon, the metal that oxidizes more easily than iron, oxygen, and a metal element or metal elements in the external electrodes, represents 100 percent by weight, an EDS surface analysis of randomly selected 20 of the metal magnetic grains does not detect any part of its interface with the metal magnetic grains where a concentration of silicon is 10 percent by weight or higher at randomly selected locations.

4. The coil component according to claim 1, wherein:
the external electrodes are each constituted by baked conductive film and contain a metal element as a primary component; and
over an entire area of a square whose one side is ⅓d and which is located at a randomly selected position in a region, within the external electrode, away by at least ½d from an interface of the bonding part with the external electrode toward an external surface side of the external electrode, where d represents a total thickness of a portion of the external electrode which is constituted by a single layer facing the bonding part, a concentration of the metal element is 90 percent by weight or higher, while a concentration of silicon is lower than 1 percent by weight.

5. The coil component according to claim 1, wherein the external electrodes contain silver.

6. The coil component according to claim 1, wherein the bonding part between the metal magnetic grains and the external electrodes is such that its thickness over a shortest distance between the metal magnetic grains and the external electrodes is 10 nm or greater but no greater than 100 nm.

7. An electronic device comprising:
the coil component according to claim 1; and
a circuit board on which the coil component is mounted.

* * * * *